United States Patent
Ryu et al.

(10) Patent No.: US 7,339,182 B2
(45) Date of Patent: Mar. 4, 2008

(54) VACUUM EVAPORATOR

(75) Inventors: Seoung-Yoon Ryu, Suwon-si (KR); Kyong-Tae Yu, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 44 days.

(21) Appl. No.: 11/325,348

(22) Filed: Jan. 5, 2006

(65) Prior Publication Data

US 2006/0145103 A1 Jul. 6, 2006

(30) Foreign Application Priority Data

Jan. 6, 2005 (KR) .................... 10-2005-0001326

(51) Int. Cl.
  *G21K 4/00* (2006.01)
  *H05B 33/00* (2006.01)
(52) U.S. Cl. .................... 250/581; 250/484.4
(58) Field of Classification Search .............. 250/581, 250/582, 484.4, 370.11, 306; 427/66, 78; 118/620
  See application file for complete search history.

(56) References Cited

U.S. PATENT DOCUMENTS

| | | | | |
|---|---|---|---|---|
| 4,925,829 A | * | 5/1990 | Fujita et al. ................ 505/473 |
| 5,065,697 A | * | 11/1991 | Yoshida et al. ............. 118/719 |
| 5,647,945 A | * | 7/1997 | Matsuse et al. ......... 156/345.38 |
| 5,705,226 A | * | 1/1998 | Fukui et al. ................ 427/250 |
| 6,676,990 B1 | * | 1/2004 | Hatwar et al. ................ 427/66 |
| 6,797,952 B2 | * | 9/2004 | Kaito et al. ................. 250/306 |
| 6,894,290 B2 | * | 5/2005 | Iwabuchi et al. ......... 250/484.4 |
| 7,165,340 B2 | * | 1/2007 | Long et al. .................... 34/61 |
| 2002/0088952 A1 | * | 7/2002 | Rao et al. .............. 250/559.45 |
| 2004/0046129 A1 | * | 3/2004 | Hosoi et al. ............. 250/484.4 |
| 2004/0144927 A1 | * | 7/2004 | Auner et al. ........... 250/370.11 |
| 2004/0149929 A1 | * | 8/2004 | Miyake .................... 250/484.4 |
| 2005/0077478 A1 | * | 4/2005 | Isoda et al. .............. 250/484.4 |
| 2006/0049370 A1 | * | 3/2006 | Shoji et al. ................. 250/581 |

FOREIGN PATENT DOCUMENTS

JP  61-140131  6/1986
JP  04-204201  7/1992

* cited by examiner

*Primary Examiner*—David Porta
*Assistant Examiner*—Faye Boosalis
(74) *Attorney, Agent, or Firm*—H.C. Park & Associates, PLC

(57) ABSTRACT

A vacuum evaporator including a vacuum chamber and a source arranged in the vacuum chamber to supply a deposition material to a substrate on which a layer is formed. A crystal sensor measures a deposition speed of the deposition material. The crystal sensor includes an insert having a hole, and the insert is arranged in front of the crystal sensor.

17 Claims, 3 Drawing Sheets

VACUUM EVAPORATOR

CROSS-REFERENCE TO RELATED APPLICATION

This application claims priority to and the benefit of Korean Patent Application No. 2005-1326, filed on Jan. 6, 2005, which is hereby incorporated by reference for all purposes as if fully set forth herein.

BACKGROUND OF THE INVENTION

1. Field of the Invention

The present invention relates to a vacuum evaporator and, more particularly, to a vacuum evaporator capable of slowing the degradation of the sensitivity of a crystal sensor that detects layer thickness.

2. Discussion of the Background

Generally, a vacuum evaporation method is widely used to form an organic layer.

The vacuum evaporation method includes forming a thin layer by installing a source under a vacuum chamber and a substrate for forming a layer on the vacuum chamber. An apparatus for forming an organic thin layer using the vacuum evaporation method includes a vacuum exhaust system connected to the vacuum chamber, and it is configured to maintain the vacuum chamber in a vacuum using the vacuum exhaust system, and then to evaporate a deposition material from at least one source.

The source includes a crucible for receiving an organic thin layer forming material and a heater wound around the crucible to heat the crucible. The heater's temperature is increased to heat the crucible to a predetermined temperature, thereby evaporating the organic thin layer forming material.

A substrate, at which the thin layer is to be formed, is disposed in the vacuum chamber spaced apart from an upper part of the source. A thickness monitor head, which is included at one side of the substrate, includes a crystal sensor for measuring the thickness of the thin layer deposited on the substrate.

The organic thin layer forming material that is evaporated from the source moves to the substrate and then passes through sequential processes such as adsorption, evaporation, re-evaporation and so on, so that it may be solidified on the substrate, thereby forming the thin layer. Here, the thickness of the thin layer may be determined by measuring a layer forming speed using the crystal sensor.

As described above, while the thin layer is deposited on the substrate, the deposition material may also be deposited on a surface of the crystal sensor, thereby applying stress to the crystal sensor, and the crystal sensor may be damaged by the heat used to evaporate the deposition material, which decreases the sensitivity of the crystal sensor. In this case, the thickness of the thin layer deposited on the substrate may not be precisely measured. Furthermore, the crystal sensor's lifetime may decrease, and the vacuum evaporator's maintenance cost may increase.

SUMMARY OF THE INVENTION

The present invention provides a vacuum evaporator capable of slowing the degradation of the sensitivity and lifetime of a crystal sensor by including an insert, which has a hole for exposing a portion of the crystal sensor, in front of the crystal sensor.

Additional features of the invention will be set forth in the description which follows, and in part will be apparent from the description, or may be learned by practice of the invention.

The present invention discloses a vacuum evaporator including a vacuum chamber, and a source arranged at a bottom of the vacuum chamber, receiving a deposition material therein, and having a heater at an exterior thereof. A substrate fixture fixes a substrate over the source, and the deposition material is deposited on the substrate. A crystal sensor is arranged at a side of the substrate and has an insert having a hole of a predetermined size in front of the crystal sensor.

The present invention also discloses a vacuum evaporator including a vacuum chamber, a source arranged in the vacuum chamber to supply a deposition material to a substrate, and a crystal sensor to measure a deposition speed of the deposition material. The crystal sensor includes an insert having a hole, and the insert is arranged in front of the crystal sensor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
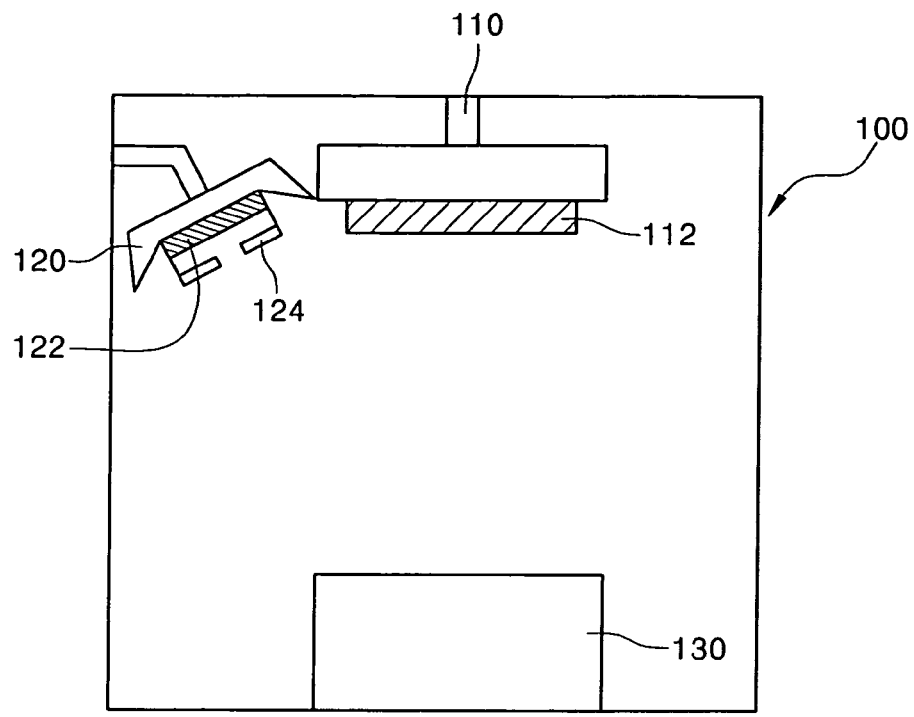
FIG. 1 is a schematic plan view of a vacuum evaporator in accordance with an exemplary embodiment of the present invention.

Hereinafter, a vacuum evaporator according to exemplary embodiments of the present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity.

Figure 2A:
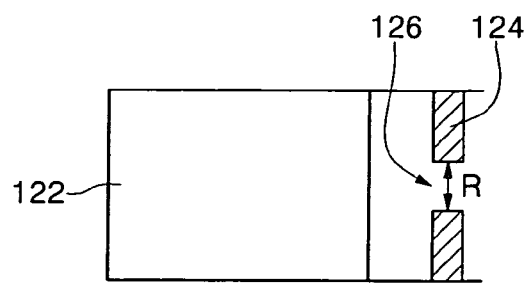
FIG. 2A and FIG. 2B are schematic cross-sectional views of a crystal sensor having an insert in accordance with an exemplary embodiment of the present invention.
Figure 2B:
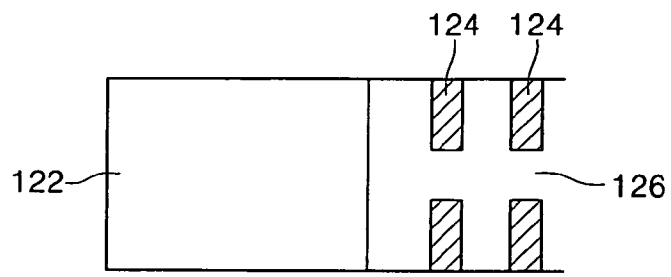

FIG. 1 is a schematic plan view of a vacuum evaporator in accordance with an exemplary embodiment of the present invention, and FIG. 2A and FIG. 2B are schematic cross-sectional views of a crystal sensor having an insert in accordance with an exemplary embodiment of the present invention. FIG. 1, FIG. 2A and FIG. 2B show components necessary for understanding the invention. Hence, other components are not included for ease of description.

Referring to FIG. 1, FIG. 2A and FIG. 2B, the vacuum evaporator includes a vacuum chamber 100, a substrate 112 arranged at an upper part of the vacuum chamber 100 by a substrate fixture 110, a thickness measuring head 120 arranged at one side of the substrate 112 and including a crystal sensor 122 and an insert 124 having a hole 126, and a source 130 arranged at the bottom of the vacuum chamber 100.

The vacuum evaporator may use an organic or inorganic material as a deposition material.

The insert 124 is arranged in front of the crystal sensor 122 by a supporter, and one or two inserts may be included, as shown in FIG. 2A and FIG. 2B.

When a diameter R of the hole 126 formed in the insert 124 is too small, it may be difficult to accurately measure the thickness of the thin layer deposited on the substrate 112. On the other hand, when the diameter R of the hole 126 is too large, the insert 124 is not useful. Accordingly, the diameter R of the hole 126 may be in a range of 5 mm to 13 mm. When the diameter of the hole 126 is in a range of 8 mm to 13 mm, it may be possible to obtain an optimal effect.

Figure 3:
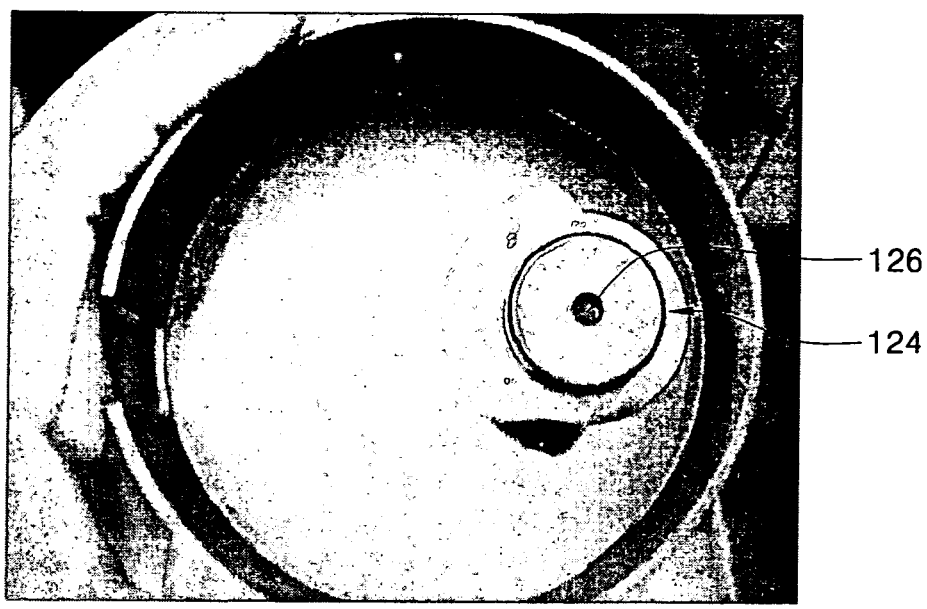
FIG. 3 is a photograph of an insert in accordance with an exemplary embodiment of the present invention.

FIG. 3 is a photograph of an insert 124 in accordance with an exemplary embodiment of the present invention, in which a hole 126 is formed substantially at the center of the insert 124.

Figure 4:
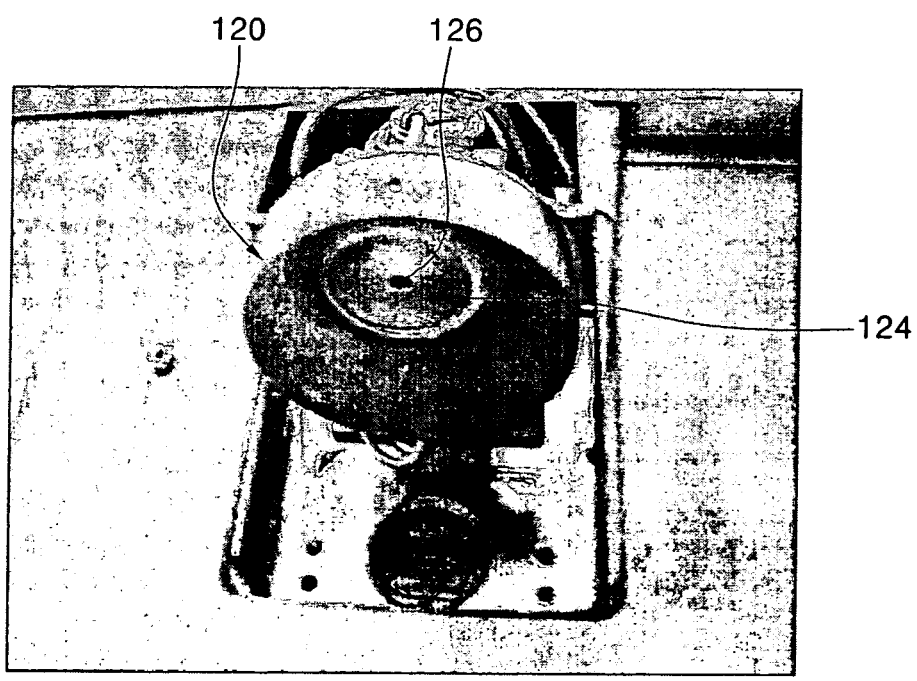
FIG. 4 is a photograph of a portion of a vacuum evaporator including an insert in accordance with an exemplary embodiment of the present invention.

FIG. 4 is a photograph of a portion of a vacuum evaporator including an insert in accordance with an exemplary embodiment of the present invention. Referring to FIG. 4, the insert 124 of FIG. 3 is installed in front of the crystal sensor (not shown), which is installed in the thickness measuring head 120. Since the crystal sensor is exposed through only the hole 126 formed in the insert 124, damage to the crystal sensor caused by heat during the deposition of the thin layer may be decreased, and the amount of deposition material that is deposited on the surface of the crystal sensor may significantly decrease.

Figure 5:
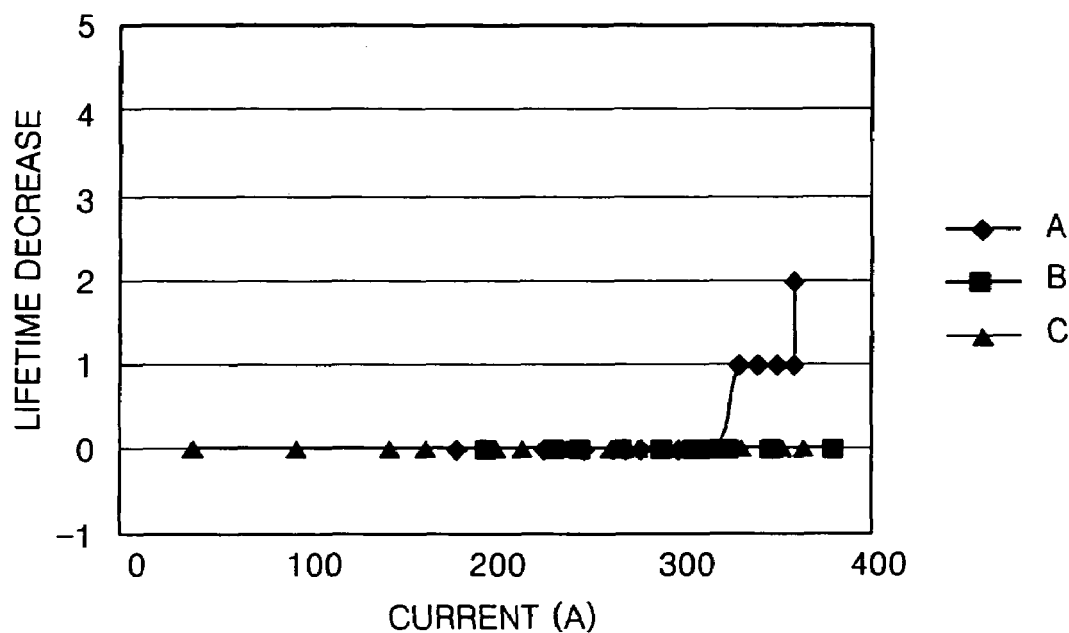
FIG. 5 is a graph showing the lifetime decrease of a crystal sensor in accordance with an exemplary embodiment of the present invention.

FIG. 5 is a graph showing the lifetime decrease of a crystal sensor in accordance with embodiments of the present invention. Referring to FIG. 5, (A) denotes a case when the insert is not installed, (B) denotes a case when the insert having an 8 mm diameter hole is installed, and (C) denotes a case when the insert having a 13 mm diameter hole is installed.

As (A) in FIG. 5 shows, the lifetime of the crystal sensor may sharply decrease when the insert is not installed.

Figure 6:
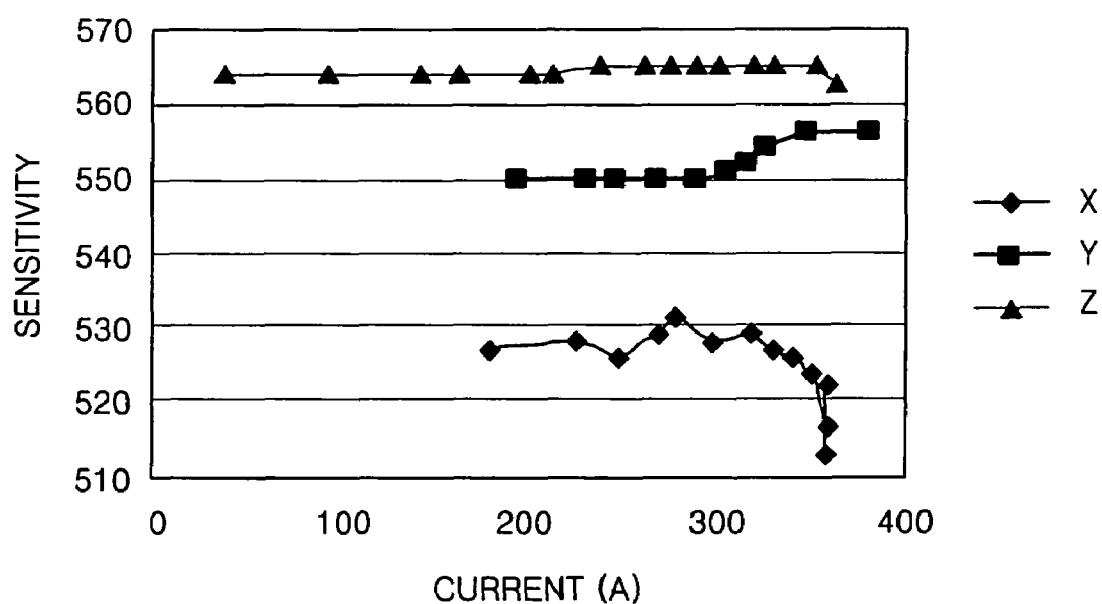
FIG. 6 is a graph showing the sensitivity of a crystal sensor in accordance with an exemplary embodiment of the present invention.

FIG. 6 is a graph showing the sensitivity of a crystal sensor in accordance with exemplary embodiments of the present invention. Referring to FIG. 6, (X) denotes a case when the insert is not installed, (Y) denotes a case when the insert having an 8 mm diameter hole is installed, and (Z) denotes a case when the insert having a 13 mm diameter hole is installed.

FIG. 6 shows that the sensitivity of the crystal sensor is maintained at a certain level (Y) when the insert having an 8 mm diameter hole is installed, and (Z) when the insert having a 13 mm diameter hole is installed. However, the sensitivity of the crystal sensor may be sharply decreased (X) when the insert is not installed.

Hence, according to FIG. 6, it is anticipated that an error of the thickness of the thin layer deposited on the substrate may be minimized since variation in the sensitivity of the crystal sensor may be less when a hole of a diameter of 8 mm to 13 mm is formed in the insert.

As described above, exemplary embodiments of the present invention may prevent the crystal sensor from being heat-damaged by arranging the insert having the hole of a predetermined size in front of the crystal sensor, and may prevent evaporated or sublimated deposition material from being deposited on the entire surface of the crystal sensor, thereby preventing the sensitivity of the crystal sensor from decreasing. Accordingly, the crystal sensor may more accurately detect layer thickness, and the crystal sensor's lifetime may increase.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A vacuum evaporator, comprising:
   a vacuum chamber;
   a source arranged at a bottom of the vacuum chamber, to receive a deposition material therein, the source comprising a heater at an exterior thereof;
   a substrate fixture to fix a substrate over the source, the deposition material from the source for deposition on the substrate;
   a crystal sensor arranged at a side of the substrate; and
   an insert having a hole in front of the crystal sensor.

2. The vacuum evaporator of claim 1, wherein the deposition material is one of an organic material and an inorganic material.

3. The vacuum evaporator of claim 1, wherein two inserts are arranged in front of the crystal sensor.

4. The vacuum evaporator of claim 1, wherein the hole has a diameter in a range of 5 mm to 13 mm.

5. The vacuum evaporator of claim 4, wherein the hole has a diameter of 8 mm.

6. The vacuum evaporator of claim 4, wherein the hole has a diameter of 13 mm.

7. The vacuum evaporator of claim 1, wherein the insert is fixed in front of the crystal sensor by a supporter.

8. The vacuum evaporator of claim 1, wherein the hole is arranged substantially in a center of the insert.

9. A vacuum evaporator, comprising:
   a vacuum chamber;
   a source arranged in the vacuum chamber to supply a deposition material to a substrate;
   a crystal sensor to measure a deposition speed of the deposition material; and
   an insert having a hole, the insert being arranged in front of the crystal sensor.

10. The vacuum evaporator of claim 9, wherein the deposition material is one of an organic material and an inorganic material.

11. The vacuum evaporator of claim 9, wherein two inserts are arranged in front of the crystal sensor.

12. The vacuum evaporator of claim 9, wherein the hole has a diameter in a range of 5 mm to 13 mm.

13. The vacuum evaporator of claim 12, wherein the hole has a diameter of 8 mm to 13 mm.

14. The vacuum evaporator of claim 9, wherein the insert is fixed in front of the crystal sensor by a supporter.

15. The vacuum evaporator of claim 9, wherein the hole is arranged substantially in a center of the insert.

16. The vacuum evaporator of claim 15, wherein the source is arranged at a bottom of the vacuum chamber, the substrate is arranged over the source, and the crystal sensor is arranged at a side of the substrate.

17. The vacuum evaporator of claim 16, wherein the insert is fixed in front of the crystal sensor by a supporter, the supporter being coupled with the crystal sensor.

* * * * *